United States Patent
Jung

(10) Patent No.: US 8,081,434 B2
(45) Date of Patent: Dec. 20, 2011

(54) DISPLAY DEVICE

(75) Inventor: Myung Woo Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 498 days.

(21) Appl. No.: 11/965,245

(22) Filed: Dec. 27, 2007

(65) Prior Publication Data

US 2008/0211374 A1    Sep. 4, 2008

(30) Foreign Application Priority Data

Mar. 2, 2007   (KR) ......................... 10-2007-0020749

(51) Int. Cl.
*H01K 5/00*     (2006.01)
*H01K 7/00*     (2006.01)

(52) U.S. Cl. ......... 361/679.21; 361/679.22; 361/679.26; 361/679.55; 361/679.56

(58) Field of Classification Search ............. 361/679.21, 361/679.22, 679.26, 679.55, 679.56
See application file for complete search history.

(56) References Cited

U.S. PATENT DOCUMENTS

2005/0264982 A1 *  12/2005  Kim et al. ..................... 361/679
2006/0044745 A1 *   3/2006  Kim ............................... 361/681
* cited by examiner

*Primary Examiner* — Anthony Haughton
(74) *Attorney, Agent, or Firm* — Brinks Hofer Gilson & Lione

(57) ABSTRACT

A display device is disclosed that can prevent pressing of a substrate and exposure of D-IC to the outside. The display includes a display panel, a driving circuit on one side of a rear surface of the display panel, the driving circuit driving the display panel, and a case receiving the display panel and the driving circuit. The case includes a slit having a predetermined space to expose the driving circuit, and both ends of the slit include a spacer supporting a lower portion of the display panel.

4 Claims, 3 Drawing Sheets

DISPLAY DEVICE

CROSS-REFERENCE TO RELATED APPLICATIONS

The present application claims priority under 35 U.S.C. 119 and 35 U.S.C. 365 to Korean Patent Application No. 10-2007-0020749 (filed on Mar. 2, 2007), which is hereby incorporated by reference in its entirety.

BACKGROUND

The present disclosure relates to a display device, and more particularly, to a display device that can prevent pressing of a substrate and exposure of a driver-integrated circuit (D-IC) to the outside.

The OLED includes an OLED panel displaying an image, a driving circuit (e.g., D-IC) driving the OLED panel, and a structure protecting the OLED panel and the driving circuit. The driving circuit, which is disposed on a rear surface of the OLED panel, includes a plurality of circuit elements which are mounted on a printed circuit board (PCB). The driving circuit is installed on a lower portion of the rear surface of the OLED panel.

The OLED panel and the driving circuit installed on the rear surface of the OLED panel are protected by a structure, which includes a panel guide supporting the OLED panel and a case covering the OLED panel and the driving circuit.

In a related art OLED, a slit is formed in a position corresponding to the driving circuit in the case covering the OLED panel and the driving circuit to expose the driving circuit to the outside, thereby making the OLED slim.

The driving circuit is exposed to the outside without being covered by the case to make the OLED slim. However, a vacant space is formed between the slit exposing the driving circuit and the OLED panel due to structural characteristics of the case. As a result, when an external force or pressing is applied to the OLED, the lower portion of the OLED panel corresponding to the slit is pressed due to the vacant space. When the lower portion of the OLED panel is pressed, the driving circuit disposed on the lower portion of the rear surface of the OLED panel is exposed outside the slit of the case. Therefore, a malfunction of the driving circuit may occur. In addition, the lower portion of the OLED panel may be broken when the external force or pressing is applied to the OLED.

SUMMARY

Accordingly, the present disclosure is directed to a liquid crystal display device that substantially obviates one or more of the problems due to limitations and disadvantages of the related art.

Embodiments provide a display device that can prevent pressing of a substrate.

Embodiments also provide a display device that can prevent exposure of a D-IC from the outside.

In one embodiment, a display device includes: a display panel; a driving circuit on one side of a rear surface of the display panel, the driving circuit driving the display panel; and a case receiving the display panel and the driving circuit, the case including a slit having a predetermined space to expose the driving circuit, wherein both ends of the slit includes a spacer supporting a lower portion of the display panel.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description servo to explain the principle of the disclosure.

DETAILED DESCRIPTION OF THE EMBODIMENTS

Reference will now be made in detail to the embodiments of the present disclosure, examples of which are illustrated in the accompanying drawings.

Figure 1:
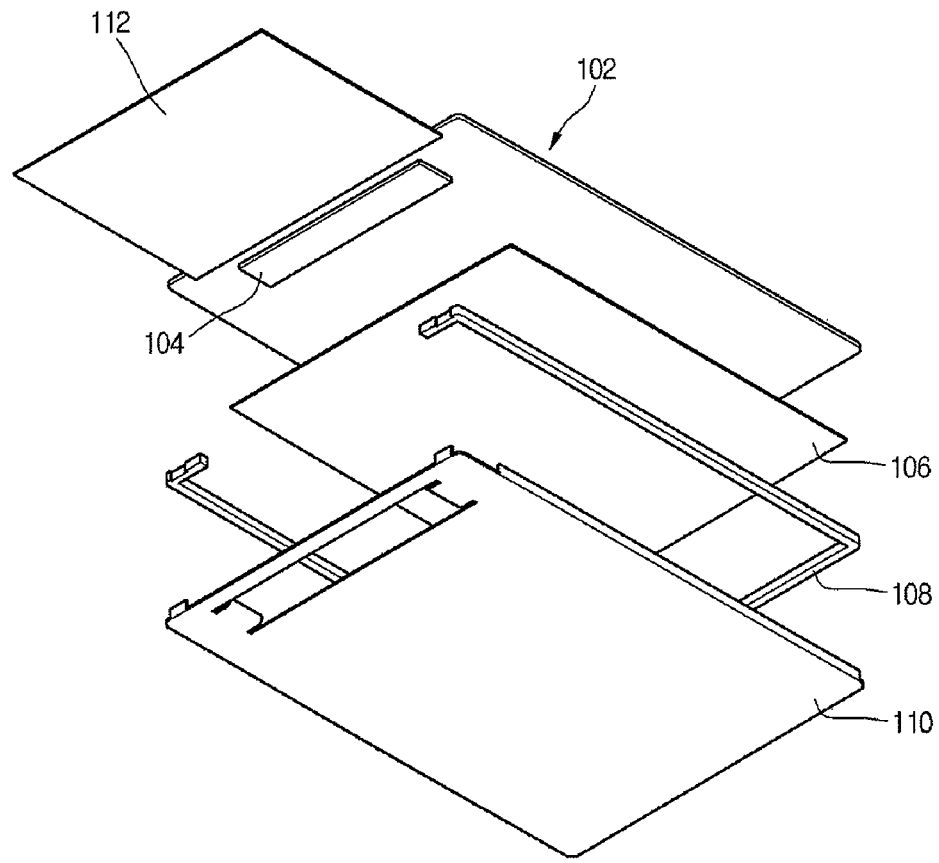
FIG. 1 is an exploded perspective view of a display device according to the present disclosure.

FIG. 1 is an exploded perspective view of a display device according to the present disclosure.

Referring to FIG. 1, a display device includes a display panel 102, a flexible printed circuit board (FPC) 112, a guide panel 108, a case 110, and a double-sided tape 106. The display panel 102 displays an image. The driving circuit 104 is disposed on a rear surface of the display panel 102 to drive the display panel 102. The FPC 112 is connected to one side of the display panel 102 to transfer various control signals and image signals received from an external system to the driving circuit 104. The guide panel 108 supports the display panel 102. The case covers the display panel 102 and the guide panel 108. The double-sided tape 106 fixes the display panel 102 to the case 110.

An OLED panel is used as the display panel 102. The display panel 102 includes an insulating substrate, a light emitting unit disposed on the insulating substrate, a protective layer covering the light emitting unit, and a protective substrate attached to the protective layer. The light emitting unit emits light using recombination of an electron and a hole, and is formed of a low-molecular organic material or a high-molecular organic material. The protective layer and the protective substrate protect the light emitting unit against external impact, humidity, and air.

In embodiments, the display panel 102 employs a bottom emission method in which light is emitted in a direction of the insulating substrate.

The driving circuit 104 is installed on one side of the rear surface of the display panel 102, e.g., a glass substrate, and includes a plurality of circuit elements, which are mounted on a PCB. The driving circuit 104 is connected to the FPC 112 to drive the display panel 102 using various control signals and image signals received from the FPC 112.

The guide panel 108 surrounds side surfaces of the display panel 102 and is received within the case 110 to support the display panel 102 to the case 110. The display panel 102 is received within the case 110 using the double-sided tape 106. The double-sided tape 106 is formed of a transparent material.

A detailed description of the case 110 will be described below with reference to FIG. 2.

Figure 2:
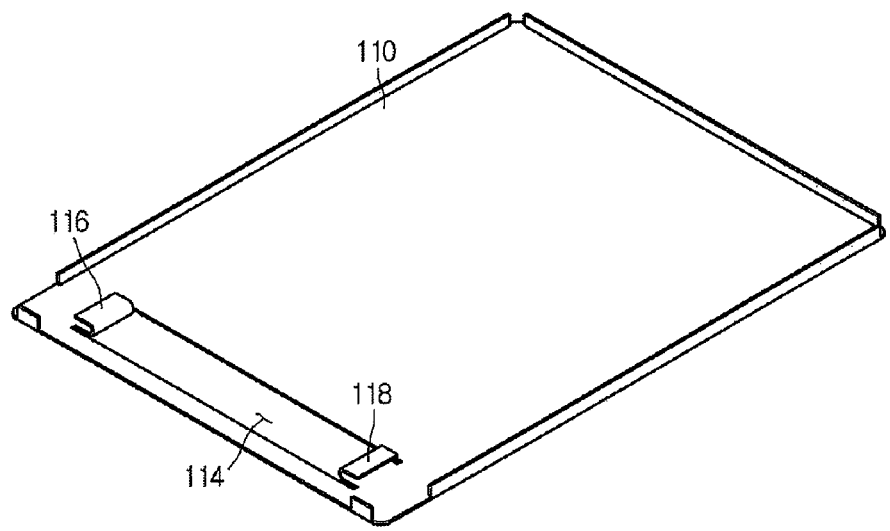
FIG. 2 is a detailed view illustrating the case of FIG. 1.

FIG. 2 is a detailed view illustrating the case of FIG. 1.

Referring to FIGS. 1 and 2, the case 100 of the display device includes a receiving space whose front surface is opened to define a display region. On the other hand, a rear surface, which is the interior of the case, is defined as a shield region shielding a display panel (refer to reference number 102 of FIG. 1). As described above, the case 110 includes the receiving space such that the display panel 102 illustrated in FIG. 1 is stably received in the receiving space. The case 110 further includes a guide that can prevent the display panel 102 from separating from the case 110.

In the shield region, a portion inside the case 110 is removed to define a predetermined vacant space. A slit 114 having the predetermined vacant space is formed in the portion inside the case 110. The slit 114 is formed in a position corresponding to the driving circuit 104 installed on the rear surface of the display panel 102 inside the case 110. When the display panel 102 illustrated in FIG. 1 is received within the case 110, the driving circuit 104 is inserted into the slit 114 such that the driving circuit 104 is not exposed to the outside.

A first and a second bent portion 116 and 118 having a U-shape are formed at both ends of the slit 114.

Figure 3A:
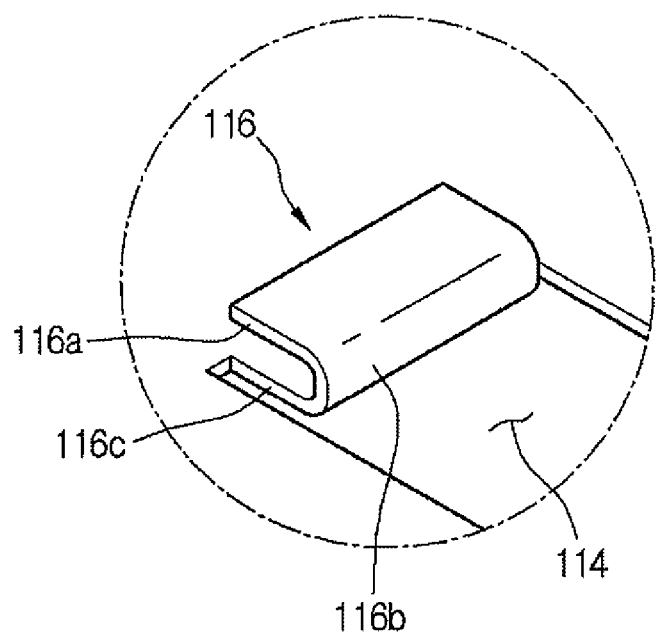
FIG. 3A is a detailed view illustrating the first bent portion of FIG. 1 according to an embodiment.

FIG. 3A is a detailed view illustrating the first bent portion of FIG. 1 according to an embodiment.

Referring to FIG. 3, a first bent portion 116 has a U-shape. The first bent portion 116 includes an extension 116c, a support 116a, and a connection 116b. The extension 116c inwardly extends from a case 110. The support 116a is opposite to the extension 116c to support a portion of the display panel 102 illustrated in FIG. 1. The connection 116b connects the support 116a to the extension 116b. The connection 116b of the first bent portion 116 is curved to follow the U-shape of the first bent portion 116.

The second bent portion 118 has the same structure as the first bent portion 116. The first and second bent portions 116 and 118 are disposed in bilateral symmetry at both ends of the slit 114.

When the display panel 102 is received within the case 110, a driving circuit 104 disposed on one side of the display panel 102 is inserted into the slit 114 of the case 110, and a portion of the display panel 102 is supported on the support 116a of the first and second bent portions 116 and 118. Accordingly, a vacant space does not exist because no gap exists between the first and second bent portions 116 and 118 and the display panel 102.

As described above, the driving circuit 104 is inserted into the slit 114 of the case 110 such that the driving circuit 104 is not exposed to the outside. The portion of the display panel 102 on which the driving circuit 104 is installed is supported on the first and second bent portions 116 and 118 formed at both ends of the slit 114.

Although an external force or pressing is applied to the display panel 102 received within the case 110, pressing occurring in a related art does not occur because the display panel 102 is supported on the first and second bent portions 116 and 118 of the case 110 without the vacant space. In addition, the driving circuit 104 installed on a rear surface of the display panel 102 is not exposed outside the slit 114 of the case 110 because the display panel 102 is not pressed.

If the first and second bent portions 116 and 118 include the support that can support the portion of the display panel 102, the first and second bent portions 116 and 118 can be designed into various shapes. The first and second bent portions 116 and 118 may include a supporting surface supporting the portion where the driving circuit 104 is disposed on the display panel 102 and at least one support capable of supporting the supporting surface. For example, the first and second bent portions 116 and 118 may have the U-shape described above and a trapezoid shape.

Figure 3B:
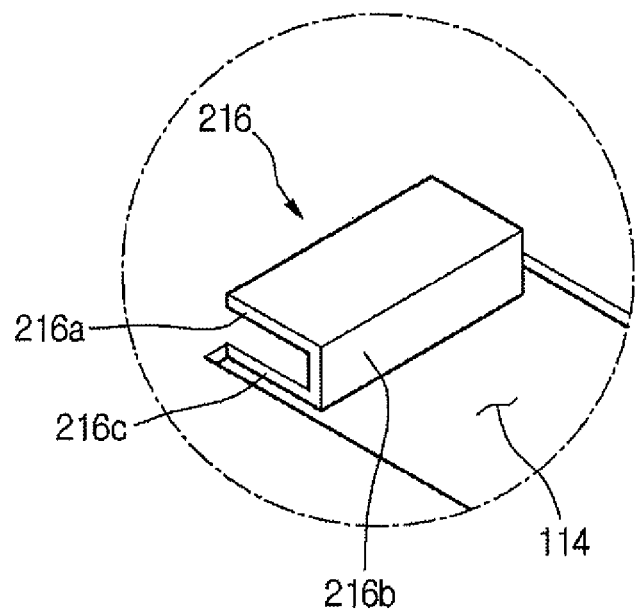
FIG. 3B is a detailed view illustrating the first bent portion of FIG. 2 according to another embodiment.

FIG. 3B is a detailed view illustrating the first bent portion of FIG. 2 according to another embodiment.

Referring to FIGS. 2 and 3B, a first bent portion 216 according to another embodiment may have a □-shape. As described above, the first bent portion 216 includes an extension 216c, a support 216a, and a connection 216b. The extension 216c inwardly extends from a case 110. The support 216a is opposite to the extension 216c to support a portion of the display panel 102 illustrated in FIG. 1. The connection 216b connects the support 216a to the extension 216b. The connection 216b may include at least one of a convex shape or a concave shape.

Figure 3C:
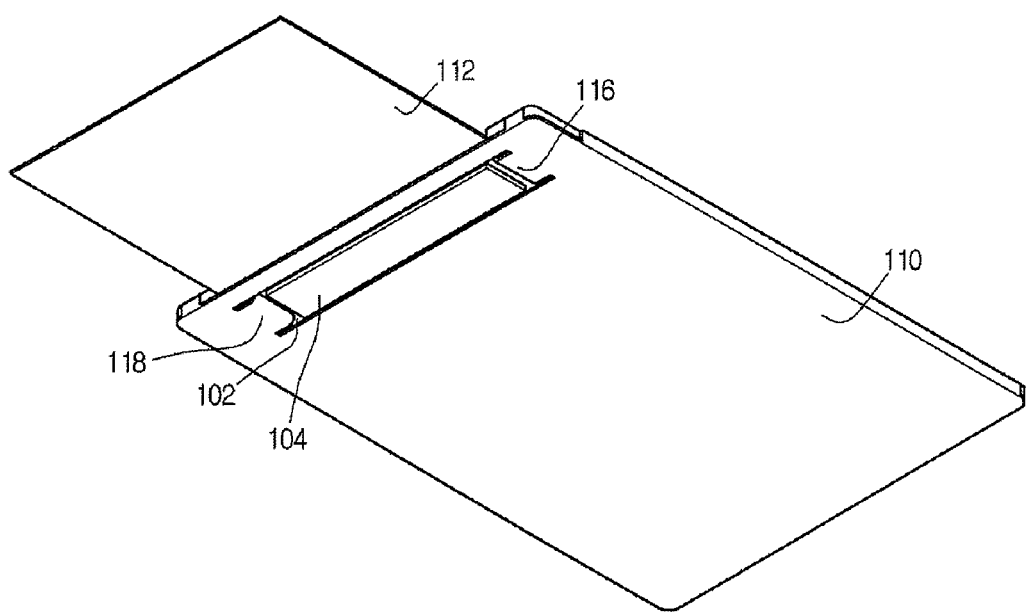
FIG. 3C is a perspective view illustrating the coupled display device of FIG. 3A.

FIG. 3C is a perspective view illustrating the coupled display device of FIG. 3A is coupled.

Referring to FIG. 3C, a display panel 102 is received within a case 110. A driving circuit 104 installed on a rear surface of the display panel 102 is inserted into a slit 114 of the case 110 such that the driving circuit 104 is not exposed to the outside. A FPC 112 is connected to one side of the display panel 102. The FPC 112 receives various control signals and image signals from an external system. Thus, the driving circuit 104 receives the various control signals and image signals through the FPC 112 to drive the display panel 102.

One side of the rear surface of the display panel 102 is supported on first and second bent portions 116 and 118 formed at both ends of the slit 114. Thus, a vacant space does not exist between the display panel 102 and the first and second bent portions 116 and 118 of the case 110.

Although an external force or pressing is applied to the display panel 102 received within the case 110, pressing occurring in a related art does not occur because the display panel 102 is supported on the first and second bent portions 116 and 118 of the case 110 without the vacant space. In addition, the driving circuit 104 installed on a rear surface of the display panel 102 is not exposed outside the slit 114 of the case 110 because the display panel 102 is not pressed. Therefore, deterioration of image quality can be prevented.

As described above, the display device according to the present disclosure includes a slit where the driving circuit can be inserted such that the driving circuit is not exposed to the outside and the case including the bent portions where the portion of the display panel is supported at the both ends of the slit. Therefore, the pressing of the display panel is prevented even when the external force or pressing is applied to the display panel.

In addition, the driving circuit installed on the one side of the display panel is not exposed outside the slit of the case because the display panel is not pressed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
   a display panel;
   a driving circuit directly formed on one side of a rear surface of the display panel, the driving circuit driving the display panel; and
   a case receiving the display panel and the driving circuit, the case comprising a slit having a predetermined space to expose the driving circuit,
   wherein the driving circuit is inserted into the slit,
   wherein a first end of the slit comprises a first bent portion and a second end of the slit comprises a second bent portion supporting a lower portion of a side of the display panel, and
   wherein upper surfaces of the first and second bent portions are contacted on the lower portion of the display panel.

2. The device according to claim 1, wherein each of the first and second bent portions comprises a supporting surface supporting the lower portion of the display panel and at least one support supporting the supporting surface.

3. The device according to claim 1, wherein the first and second bent portions are integrally formed with the case.

4. The device according to claim 1, wherein the display panel comprises an organic light emitting diode panel.

* * * * *